(12) United States Patent
Nam et al.

(10) Patent No.: US 8,318,389 B2
(45) Date of Patent: Nov. 27, 2012

(54) IMAGE SENSOR PHOTO MASK AND APPARATUS

(75) Inventors: Hyun-Hee Nam, Chungcheongbuk-do (KR); Jeong-Lyeol Park, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 0 days.

(21) Appl. No.: 13/205,241

(22) Filed: Aug. 8, 2011

(65) Prior Publication Data

US 2011/0294046 A1 Dec. 1, 2011

Related U.S. Application Data

(62) Division of application No. 12/076,334, filed on Mar. 17, 2008, now Pat. No. 8,003,307.

(30) Foreign Application Priority Data

Mar. 19, 2007 (KR) .......................... 10-2007-0026821

(51) Int. Cl.
*G03F 1/00* (2006.01)
(52) U.S. Cl. ........................................ 430/5; 430/270.1
(58) Field of Classification Search .................. None
See application file for complete search history.

(56) References Cited

U.S. PATENT DOCUMENTS

| 5,679,597 A | 10/1997 | Moon | |
| 5,835,274 A | 11/1998 | Baek | |
| 6,043,000 A * | 3/2000 | Park et al. | 430/318 |
| 2004/0005118 A1* | 1/2004 | Lee et al. | 385/43 |
| 2004/0152021 A1 | 8/2004 | Chiba et al. | |
| 2006/0183265 A1 | 8/2006 | Oh et al. | |
| 2006/0210891 A1* | 9/2006 | Progler et al. | 430/5 |
| 2007/0262406 A1 | 11/2007 | Yoshida | |

FOREIGN PATENT DOCUMENTS

| CN | 1819220 | 8/2006 |
| JP | 58-185850 | 12/1983 |
| JP | 05-088335 | 4/1993 |
| JP | 2003-287608 | 10/2003 |
| JP | 2004-071931 | 3/2004 |
| KR | 19970022517 | 5/1997 |
| KR | 10-2001-0086625 | 9/2001 |
| KR | 10-0649861 | 11/2006 |

* cited by examiner

*Primary Examiner* — John A. McPherson
(74) *Attorney, Agent, or Firm* — McAndrews, Held & Malloy Ltd.

(57) ABSTRACT

A method for fabricating an image sensor includes forming an insulation layer over a substrate in a logic circuit region and a pixel region, forming a photoresist over the insulation layer, patterning the photoresist to form a photoresist pattern where the insulation layer in the pixel region is exposed and the insulation layer in the logic circuit region is not exposed, wherein a thickness of the photoresist pattern is gradually decreased in an interfacial region between the pixel region and the logic circuit region in a direction of the logic circuit region to the pixel region, and performing an etch back process over the insulation layer and the photoresist pattern in conditions that an etch rate of the photoresist pattern are substantially the same as that of the insulation layer.

18 Claims, 6 Drawing Sheets

IMAGE SENSOR PHOTO MASK AND APPARATUS

CROSS-REFERENCE TO RELATED APPLICATIONS/INCORPORATION BY REFERENCE

The present patent application is a Divisional of application Ser. No. 12/076,334, filed Mar. 17, 2008, which claims priority of Korean patent application number 10-2007-0026821 filed on Mar. 19, 2007. The present patent application incorporates both of the above identified applications by reference in their entirety.

BACKGROUND OF THE INVENTION

The present invention relates to an image sensor and a method for fabricating the same, and more particularly, to an image sensor fabricated by employing complementary metal-oxide semiconductor (CMOS) technology (hereinafter, referred to as CMOS image sensor) and a method for fabricating the same.

A CMOS image sensor includes two regions, of which one is a pixel region having a photodiode and the other is a logic circuit region having circuits for processing pixel signals. A substrate structure of the pixel region will be described hereafter. A photodiode is formed over a substrate, a plurality of insulation layers is formed over the photodiode in order to insulate layers therebetween and passivate a device. Furthermore, a color filter for absorbing a color and a micro lens for collecting light are formed over the plurality of the insulation layers.

Generally, when an amount of light incident on a photodiode in a pixel region is increased, light-sensitivity of an image sensor is improved. Thus, in order to improve characteristics of light-sensitivity, an area of a photodiode should be great or a focus length should be adjusted so as to focus the maximum amount of light on the photodiode. Furthermore, a distance from a photodiode to a micro lens should be decreased so as to decrease a loss of light to be incident on the photodiode.

However, since an area of a photodiode is decreased according to increasing of the number of pixels and a metal interconnection layer is formed of a multilayer, the thickness of an insulation layer over the photodiode is increased.

Therefore, a method for selectively etching an insulation layer in a pixel region has been employed in order to decrease a distance from a photodiode to a micro lens. That is, a mask pattern opening a pixel region and covering a logic circuit region has been used to merely etch an insulation layer in the pixel region.

A method for decreasing a distance from a micro lens to a photodiode by reducing unnecessary insulation layers over the photodiode is disclosed in U.S. Patent Application Publication No. 2006/0183265, entitled to "Image sensor having improved sensitivity and method for making same".

However, when an insulation layer is selectively etched by using a selective etching process according to the prior art, a slope having a large angle of approximately 70 degrees is formed in an etching interfacial region after the etching process, wherein the term "etching interfacial region" represents an interfacial region between a pixel region and a logic circuit region.

FIG. 1 illustrates a cross-sectional view showing a slope of an etched insulation layer in an interfacial region between a pixel region and a logic circuit region. A photoresist pattern (PR) 120 opens the pixel region while covering the logic circuit region. An insulation layer 110 in the pixel region is etched to a given depth. At this time, although a slope etch process is performed in the interfacial region, an angle of a slope in the interfacial region becomes approximately 70 degrees.

In this matter, when an angle of a slope is as great as the above mentioned case, a subsequent color filtering layer is formed with bad uniformity. Furthermore, when in a color filtering process an exposure and developing process is used after applying a photoresist for the filtering, diffused reflection is remarkably often originated from a steep slope region during the exposure process, which badly affects a photolithography process as well.

In the meantime, a slop etching process may be performed by using dry etching conditions that generate much polymer during etching an insulation layer in order to decrease an angle of a slope. However, it is hard to get a desired angle which is decreased, as much as accomplishing smooth progress of subsequent processes and the generated much polymer becomes particles not to be easily removed in a subsequent cleaning process, so that characteristics of a device and a process yield may be deteriorated.

SUMMARY OF THE INVENTION

Embodiments of the present invention are directed to provide a method for fabricating an image sensor, which can improve a margin of a subsequent process as minimizing an angle of a slope in an interfacial region between a pixel region and a logic circuit region when an insulation layer over a photodiode is etched.

In accordance with another aspect of the present invention, there is provided a photo mask used for a photolithography process to accomplish the above aspect.

In accordance with a first aspect of the present invention, there is provided a method for fabricating an image sensor. The method includes forming an insulation layer over a substrate in a logic circuit region and a pixel region, forming a photoresist over the insulation layer, patterning the photoresist to form a photoresist pattern where the insulation layer in the pixel region is exposed and the insulation layer in the logic circuit region is not exposed, wherein a thickness of the photoresist pattern is gradually decreased in an interfacial region between the pixel region and the logic circuit region in a direction of the logic circuit region to the pixel region, and performing an etch back process over the insulation layer and the photoresist pattern in conditions that an etch rate of the photoresist pattern are substantially the same as that of the insulation layer.

In accordance with a second aspect of the present invention, there is provided a photo mask for a photolithography process to selectively etch an insulation layer in a pixel region of an image sensor. The photo mask includes a first region in which a photoresist formed over a substrate is removed, wherein the first region corresponds to the pixel region, a third region in which the photoresist formed over the substrate remains without being etched, wherein the third region corresponds a logic circuit region, and a second region having a pattern by which an amount of light transferred onto the substrate is gradually decreased in a direction of the first region to the third region, wherein the second region corresponds to an interfacial region between the pixel region and the logic circuit region.

In accordance with a third aspect of the present invention, there is provided a method for fabricating an image sensor. The method includes forming an insulation layer over a substrate in a logic circuit region and a pixel region, forming a photoresist over the insulation layer, preparing a photo mask having a pattern by which an amount of light transferred onto the substrate is gradually decreased in a direction of the logic circuit region to the pixel region, wherein the pattern of the photo mask corresponds to an interfacial region between the pixel region and the logic circuit region, patterning the photoresist by using the photo mask to form a photoresist pattern where the insulation layer in the pixel region is exposed and the insulation layer in the logic circuit region is not exposed, wherein a thickness of the photoresist pattern is gradually decreased in the interfacial region in a direction of the logic circuit region to the pixel region, and performing an etch back process on the exposed insulation layer.

DESCRIPTION OF SPECIFIC EMBODIMENTS

Figure 2A:
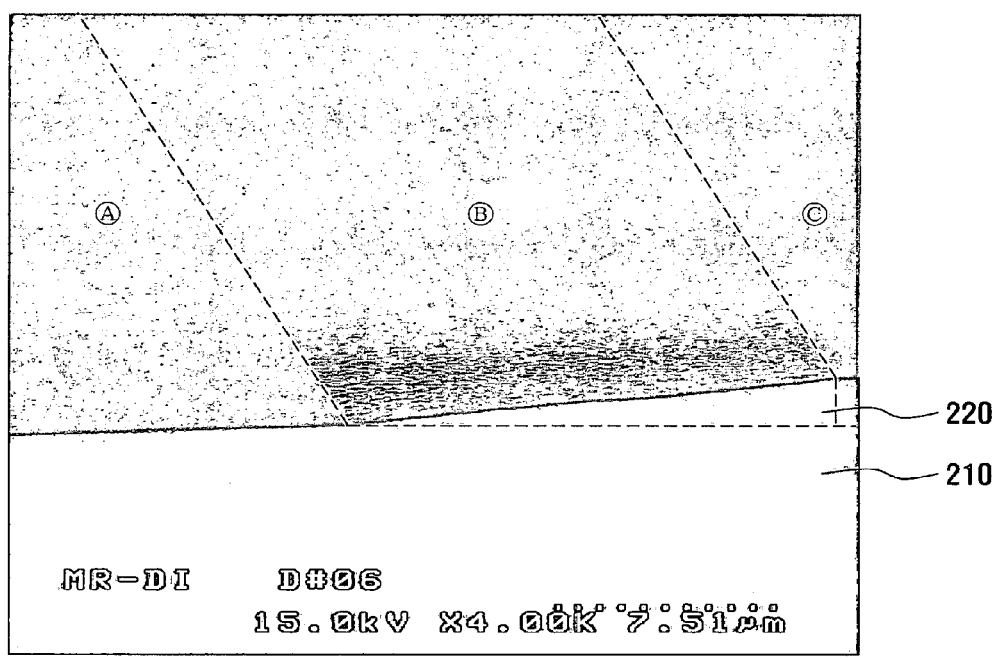
FIGS. 2A to 2C illustrate micrographic views showing progress of a method for fabricating an image sensor in accordance with an embodiment of the present invention.
Figure 2B:
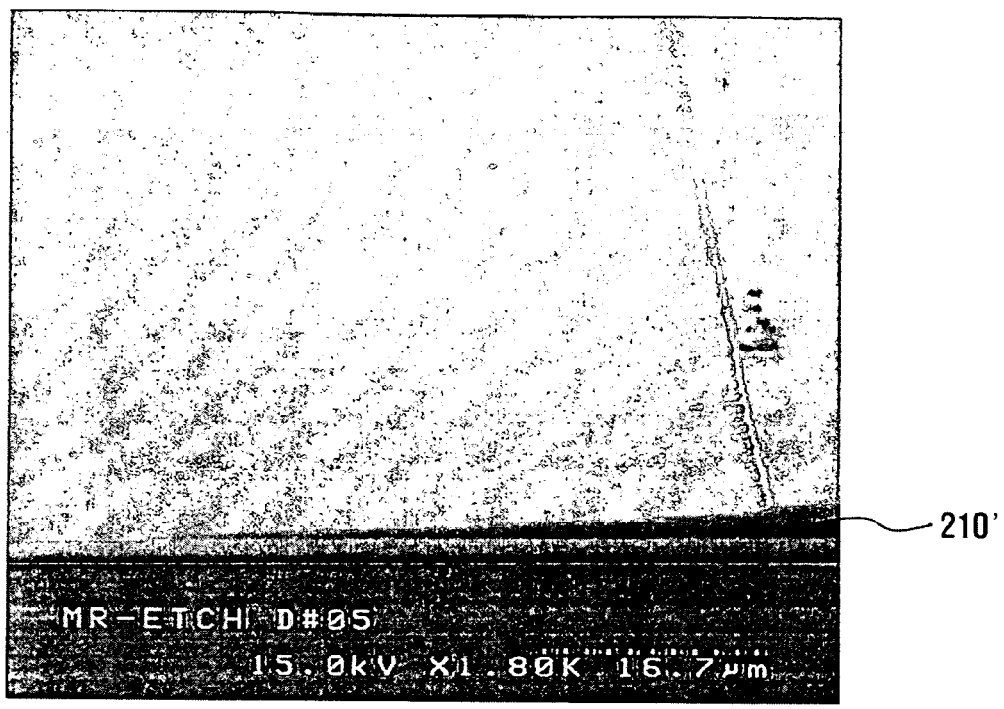
Figure 2C:
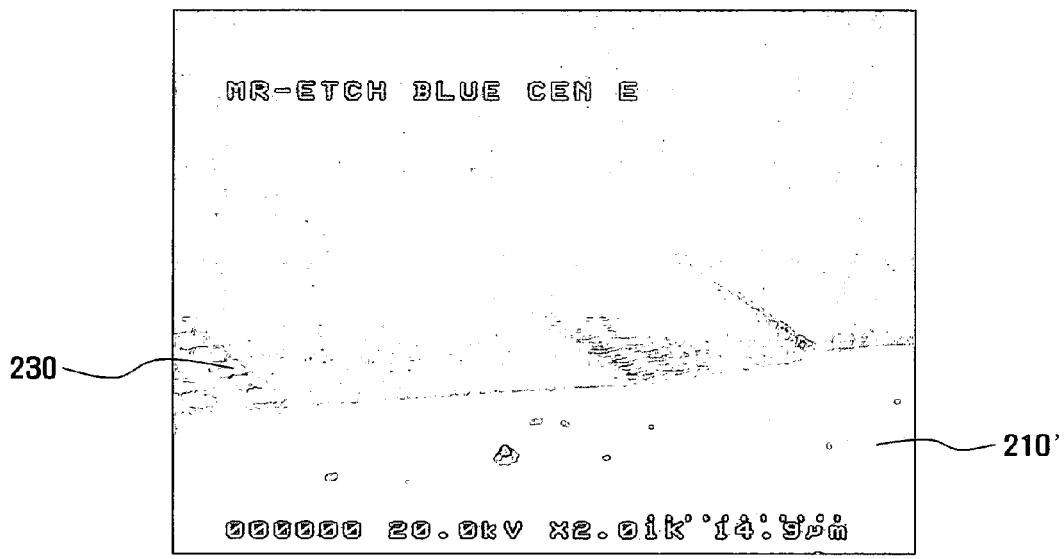

FIGS. 2A to 2C illustrate micrographic views showing progress of a method for fabricating an image sensor in accordance with an embodiment of the present invention. The micrographic views show samples fabricated by the inventive method.

The samples are fabricated by using a fabricating process for a complementary metal-oxide semiconductor (CMOS) image sensor having a line width of 0.11 µm class.

Figure 1:
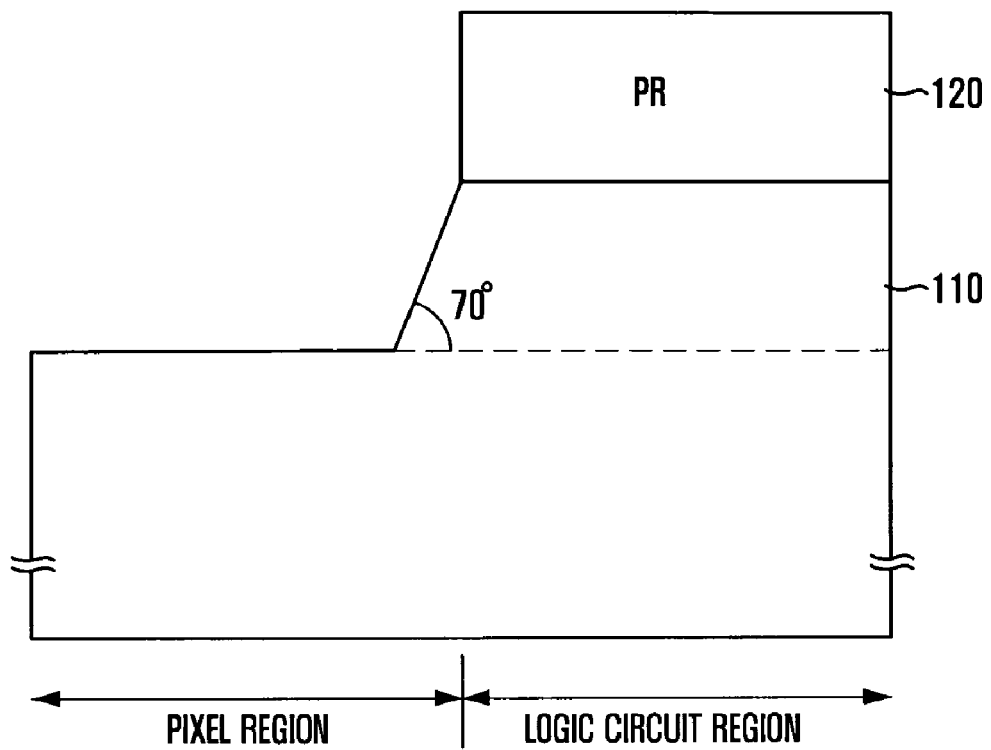
FIG. 1 illustrates a cross-sectional view showing a slope of an etched insulation layer in an interfacial region between a pixel region and a logic circuit region.

Referring to FIGS. 2A to 2C, an interfacial region between a pixel region and a logic circuit region is magnified and it is recognizable that a slope in the interfacial region is more gentle compared to the slope in the prior art illustrated in FIG. 1.

Figure 3:
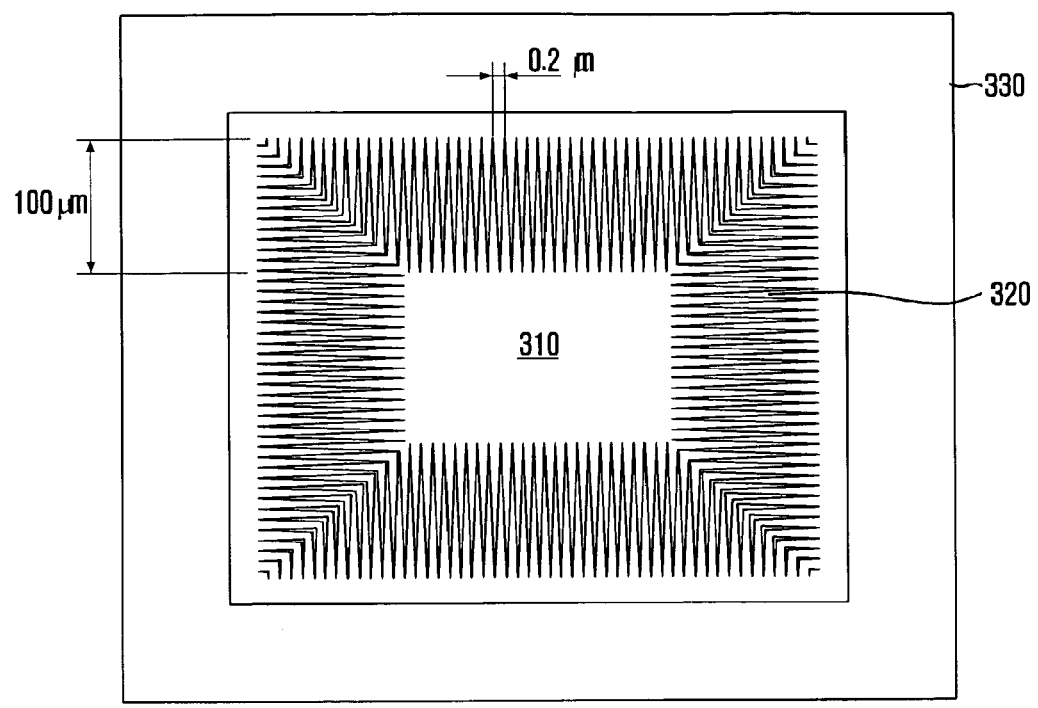
FIG. 3 illustrates a planar view of a photo mask in accordance with an embodiment of the present invention.

Referring to FIG. 2A, a positive photoresist for i-Line is formed over an insulation layer 210 to have a thickness of approximately 27,000 Å and then, an exposure process and a developing process are performed on the positive photoresist by using a photo mask suggested in the present invention. Since a planar view of the photo mask suggested in the present invention is illustrated in FIG. 3, shape of the photo mask will be described later in detail. The insulation layer 210 includes an oxide layer for inter-layer insulation of a device structure.

The exposure process is performed at a condition of illumination where NA is approximately 0.55 and σ is approximately 0.60, and at an energy of approximately 3,350 J/m² with a focus set to 0 µm in an i-Line stepper, wherein NA and σ are parameters related to lightness and image contrast, respectively. Above mentioned 'focus set to 0' means that there is no need to adjust high and low of the substrate in the i-Line stepper in order to focus on the photoresist.

A thickness of the photoresist and conditions of the exposure process may be changed in accordance with a type of devices, a type of exposure apparatuses and so on. More preferably, the exposure process is performed in a condition where illumination where NA ranges from approximately 0.4 to approximately 0.7 and σ ranges from approximately 0.4 to approximately 0.8, and at an energy of approximately 2,000 J/m² to approximately 5,000 J/m². In this condition, the focus may be set to 0 µm or may be set to a range of −1 µm to 1 µm. Although the focus is set to the range of −1 µm to 1 µm, the result may not change.

Referring to FIG. 2A, when the exposure process and the developing process are performed by using the photo mask suggested in the present invention, the photoresist over a pixel region A is removed while the photoresist over a logic circuit region C remains, so that a patterned photoresist 220 is formed. Furthermore, it is recognizable that the patterned photoresist 220 over an interfacial region B between the pixel region A and the logic circuit region C has a thickness that is gradually increased in a direction of the pixel region A to the logic circuit region C. An angle of a slope of the patterned photoresist 220 over the interfacial region B is approximately 0.5 degrees, more preferably the angle of the slope of the patterned photoresist 220 in the interfacial region B ranging from approximately 0.4 degrees to approximately 15 degrees.

Referring to FIG. 2B, an etch back process is performed in a condition for that etch rates of the patterned photoresist 220 and the insulation layer 210 are similar to each other to thereby etch the patterned photoresist 220 and the insulation layer 210 in the interfacial region B to a given depth. As a result, a slope of an etched insulation layer 210' in the interfacial region B becomes very gentle as shown in FIG. 2B. That is, the angle of the slope of the patterned photoresist 220 in the interfacial region B is reflected on the etched insulation layer 210' in the interfacial region B by the etch back process.

The etch back process is performed in a high pressure oxide etch apparatus, using gases of $CHF_3$ having a flow rate of approximately 30 sccm, $O_2$ having a flow rate of approximately 30 sccm and Ar having a flow rate of approximately 1,000 sccm in conditions of a pressure of approximately 1,000 mT and a power of approximately 800 W.

In general, a thickness of the insulation layer 210 ranges from approximately 40,000 Å to approximately 70,000 Å. When a thickness of the insulation layer 210 is approximately 46,000 Å, approximately 15,000 Å of the total thickness of the insulation layer 210 is decreased after performing the etch back process in the above mentioned condition. In other words, approximately 33% of the total thickness of the insulation layer 210 is decreased. As a result, a distance from a photodiode to a micro lens is decreased by approximately 15,000 Å.

Conditions of the etch back process may be changed in accordance with a type of devices, a type of the etch back apparatus and so on. More preferably, the etch back process is performed in conditions of a pressure of approximately 50 mT to approximately 1,500 mT and a power of approximately 300 W to approximately 1,000 W using gases of $CHF_3$ having a flow rate of approximately 10 sccm to approximately 50 sccm, $O_2$ having a flow rate of approximately 10 sccm to approximately 50 sccm and Ar having a flow rate of approximately 300 sccm to approximately 1,500 sccm.

The angle of the slope of the etched insulation layer 210' in the interfacial region B becomes very small after the etch back process is performed since the angle of the slope of the patterned photoresist 220 in the interfacial region B is reflected thereon. Since the angle of the slope of the etched insulation layer 210' in the interfacial region B is approximately 0.5 degrees, a process error by a height difference of the insulation layer 210 in the pixel region A and the logic circuit region C can be prevented during a subsequent process such as a color filtering process.

FIG. 2C shows color filters 230 formed over the etched insulation layer 210' by applying a resist for a color filter and patterning the resist. Applying the resist is very uniformly applied since the angle of the slope in the interfacial region B is very small. Thus, the color filters 230 are formed with a very fine profile.

In accordance with another embodiment of the present invention, a process for forming an anti-reflection layer between the insulation layer 210 and the patterned photoresist 220 can be added so as to further decrease a diffused reflection more during a photolithography process.

Furthermore in accordance with still another embodiment of the present invention, the insulation layer 210 may include a nitride layer or a multi layer of oxide and nitride.

In accordance with further still another embodiment of the present invention, other processes like a process for forming a device passivation layer on the etched insulation layer 210', which are known to those skilled in the art, can be additionally performed before forming the color filters.

FIG. 3 illustrates a planar view of a photo mask in accordance with an embodiment of the present invention.

Referring to FIG. 3, a photo mask includes a first region 310, a second region 320 and a third region 330.

The first region 310 corresponds to a pixel region and a photoresist over a substrate in the first region 310 is removed since the light penetrates the photoresist.

The third region 330 corresponds to a logic circuit region and the photoresist over the substrate in the third region 330 remains since the photoresist in the third region 330 is exposed to the light.

The second region 320 corresponds to an interfacial region between the pixel region and the logic circuit region and the photo mask over the substrate in the second region 320 has a sawtooth shape in order to gradually decrease an amount of light transferred to the substrate in a direction of the first region 310 to the third region 330. At this time, the sawtooth shape of the photo mask is not reflected on the substrate and an amount of the light transferred onto the substrate is varied according to the shape of the photo mask.

For example, when an i-Line light source is used for the exposure, a pitch of the photo mask in the second region 320 is preferably approximately 0.2 μm. Although the pitch of the photo mask may be changed in accordance with a type of the light source of the exposure, the pitch of the photo mask should be determined not to reflect the pattern of the photo mask the substrate but make a difference in the amount of the light transferred onto the substrate.

In the meantime, it is preferably that a width of the photo mask in the second region 320 is approximately 100 μm. The photo mask in edges of the second region 320 has a pattern structure with 45 degree chamfered joins so as to form a side like structure.

Therefore, when an exposure process and a developing process are performed by using the photo mask in accordance with the present invention, the patterned photoresist 220 having a gentle slope can be formed in the interfacial region B as shown in FIG. 2A.

Figure 4A:
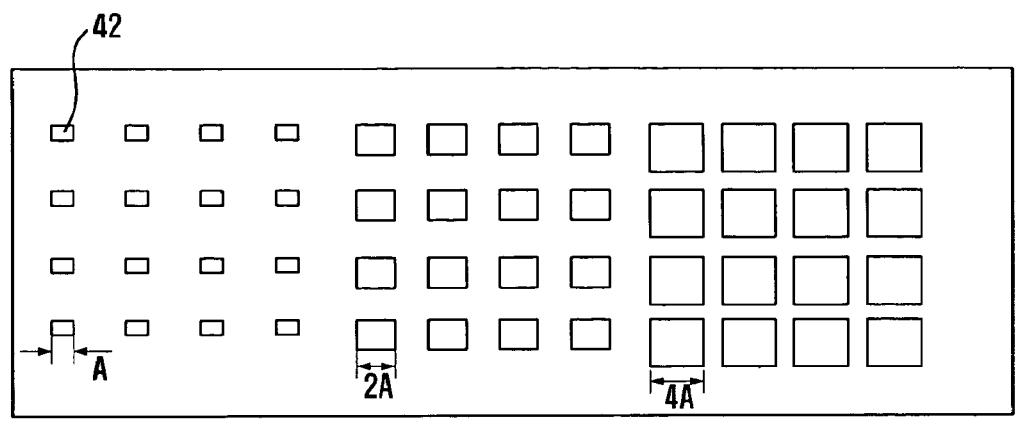
FIGS. 4A and 4B illustrate planar views showing shape of photo masks in accordance with other embodiments of the present invention.
Figure 4B:
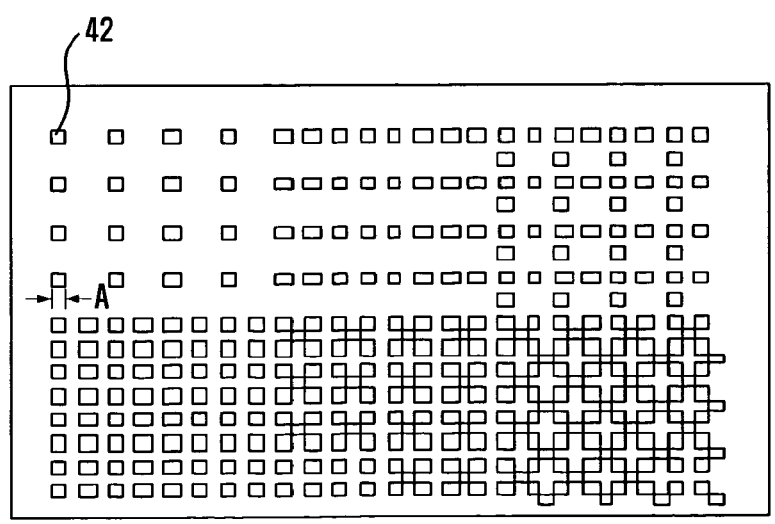

FIGS. 4A and 4B illustrate planar views showing shapes of photo masks in accordance with other embodiments of the present invention. FIGS. 4A and 4B merely show regions corresponding to an interfacial region between a pixel region and a logic circuit region.

Referring to FIG. 4A, when the number of light penetration patterns 42 is fixed, an amount of light for the exposure can be adjusted by sizes (A, 2A or 4A) of the light penetration patterns 42.

Referring to FIG. 4B, when a size of light penetration patterns 42 is fixed, i.e. A in FIG. 4B, an amount of light for the exposure can be adjusted by controlling density of the light penetration patterns 42, i.e., the number of light penetration patterns.

Thus, in order to decrease an amount of light for the exposure in a direction of the pixel region to the logic circuit region the light penetration patterns 42 having a small size are arranged in the region corresponding to the interfacial region when the number of the light penetration patterns 42 is fixed, or a small number of the light penetration patterns 42 is arranged in the region corresponding to the interfacial region when a size of the light penetration patterns 42 is fixed. Furthermore, although it is not shown, an amount of light for an exposure is adjusted by a size and the number of the light penetrating patterns 42. However, as described above, the size (A, 2A or 4A) of the light penetration pattern 42 should have a pitch not to reflect a shape of the pattern on a substrate.

In accordance with the above described embodiments, efficiency of light-receiving can be increased by reducing a thickness of insulation layers over a photodiode. Furthermore, since the insulation layer is formed with a very gentle slope in an interfacial region between a pixel region and a logic circuit region, a thin film can be more uniformly formed during a subsequent process for forming a color filter and a micro lens, so that a process margin can be improved.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A photo mask for a substrate having a photoresist layer and an insulation layer formed over both a pixel and a logic circuit configured to process signals of the pixel, the photo mask comprising:
   a pixel region positioned over the pixel, wherein the pixel region is configured to cause the photoresist layer formed over the pixel to be removed by a development process;
   a logic circuit region positioned over the logic circuit, wherein the logic circuit region is configured to cause at least a portion of the photoresist layer formed over the logic circuit to remain after the development process; and
   an interfacial region between the pixel region and the logic circuit region, wherein the interfacial region is configured to cause the developing process to decrease a thickness of the photoresist layer in a direction from the logic circuit region to the pixel region at a slope of less than 15 degrees.

2. The photo mask of claim 1, wherein, during a light exposure process:
   the pixel region is configured to expose the photoresist layer to light;
   the logic circuit region is configured to shade the photoresist layer from light; and
   the interfacial region is configured to increase exposure of the photoresist layer to light in the direction from the logic circuit region to the pixel region.

3. The photo mask of claim 1, wherein the interfacial region comprises a sawtooth shape having a pitch configured to prevent a transfer of the sawtooth shape to the photoresist layer.

4. The photo mask of claim 1, wherein:
the interfacial region comprises a plurality of light-penetrating patterns having pitches configured to prevent a transfer of a shape of the light-penetrating patterns to the photoresist layer;
a quantity of the light-penetrating patterns in the interfacial region is fixed; and
a size of the light-penetrating patterns is configured to increase exposure of the photoresist layer to light in the direction from the logic circuit region to the pixel region.

5. The photo mask of claim 1, wherein:
the interfacial region comprises a plurality of light-penetrating patterns having pitches configured to prevent a transfer of a shape of the light-penetrating patterns to the photoresist layer;
a size of the light-penetrating patterns in the interfacial region is fixed; and
a quantity of light-penetrating patterns is configured to increase exposure of the photoresist layer to light in the direction from the logic circuit region to the pixel region.

6. The photo mask of claim 1, wherein:
the interfacial region comprises a plurality of light-penetrating patterns having pitches configured to prevent a transfer of a shape of the light-penetrating patterns to the photoresist layer; and
a size and a quantity of the light-penetrating patterns are configured to increase exposure of the photoresist layer to light in the direction from the logic circuit region to the pixel region.

7. An apparatus, comprising:
an image sensor substrate including a pixel region, a logic circuit region, and an interfacial region between the pixel region and the logic circuit region;
an insulation layer over the pixel region, logic circuit region, and interfacial region;
a photoresist layer over the insulation layer; and
a photo mask over the photoresist layer;
wherein the photo mask includes a first region over the pixel region, a second region over the logic circuit region, and a third region over the interfacial region; and
wherein the third region is configured to cause a developing process to decrease a thickness of the photoresist layer in a direction from the logic circuit region to the pixel region at a slope of less than 15 degrees.

8. The apparatus of claim 7, wherein, during a light exposure process:
the first region is configured to expose the photoresist layer to light;
the second region is configured to shade the photoresist layer from light; and
the third region is configured to increase exposure of the photoresist layer to light in the direction from the logic circuit region to the pixel region.

9. The apparatus of claim 7, wherein the third region comprises a sawtooth shape having a pitch configured to prevent a transfer of the sawtooth shape to the photoresist layer.

10. The apparatus of claim 7, wherein:
the third region comprises a plurality of light-penetrating patterns having pitches configured to prevent a transfer of a shape of the light-penetrating patterns to the photoresist layer;
a quantity of the light-penetrating patterns in the third region is fixed; and
a size of the light-penetrating patterns is configured to increase exposure of the photoresist layer to light in the direction from the logic circuit region to the pixel region.

11. The apparatus of claim 7, wherein:
the third region comprises a plurality of light-penetrating patterns having pitches configured to prevent a transfer of a shape of the light-penetrating patterns to the photoresist layer;
a size of the light-penetrating patterns in the third region is fixed; and
a quantity of light-penetrating patterns is configured to increase exposure of the photoresist layer to light in the direction from the logic circuit region to the pixel region.

12. The apparatus of claim 7, wherein:
the third region comprises a plurality of light-penetrating patterns having pitches configured to prevent a transfer of a shape of the light-penetrating patterns to the photoresist layer; and
a size and a quantity of the light-penetrating patterns are configured to increase exposure of the photoresist layer to light in the direction from the logic circuit region to the pixel region.

13. A photo mask for a substrate having a photoresist layer, the photo mask comprising:
a first region configured to cause the photoresist layer formed over a pixel to be removed by a development process;
a second region configured to cause at least a portion of the photoresist layer formed over a logic circuit to remain after the development process; and
a third region between the first region and the second region;
wherein the third region is configured to cause the developing process to decrease a thickness of the photoresist layer in a direction from the second region to the first region at a slope of less than 15 degrees.

14. The photo mask of claim 13, wherein, during a light exposure process:
the first region is configured to expose the photoresist layer to light;
the second region is configured to shade the photoresist layer from light; and
the third region is configured to increase exposure of the photoresist layer to light in the direction from the second region to the first region.

15. The photo mask of claim 13, wherein the third region comprises a sawtooth shape having a pitch configured to prevent a transfer of the sawtooth shape to the photoresist layer.

16. The photo mask of claim 13, wherein:
the third region comprises a plurality of light-penetrating patterns having pitches configured to prevent a transfer of a shape of the light-penetrating patterns to the photoresist layer;
a quantity of the light-penetrating patterns in the third region is fixed; and
a size of the light-penetrating patterns is configured to increase exposure of the photoresist layer to light in the direction from the second region to the first region.

17. The photo mask of claim 13, wherein:
the third region comprises a plurality of light-penetrating patterns having pitches configured to prevent a transfer of a shape of the light-penetrating patterns to the photoresist layer;
a size of the light-penetrating patterns in the third region is fixed; and
a quantity of light-penetrating patterns is configured to increase exposure of the photoresist layer to light in the direction from the second region to the first region.

18. The photo mask of claim 13, wherein:

the third region comprises a plurality of light-penetrating patterns having pitches configured to prevent a transfer of a shape of the light-penetrating patterns to the photoresist layer; and a size and a quantity of the light-penetrating patterns are configured to increase exposure of the photoresist layer to light in the direction from the second region to the first region.

\* \* \* \* \*